(12) United States Patent
Sekiya

(10) Patent No.: US 6,650,113 B2
(45) Date of Patent: Nov. 18, 2003

(54) DETECTOR AND METHOD THEREOF FOR DETERMINING MAGNETIC FLUX BASED ON ELECTROMOTIVE FORCE INDUCED BY AN EXCITATION CURRENT

(75) Inventor: Shigenobu Sekiya, Wako (JP)

(73) Assignee: Honda Giken Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/084,918

(22) Filed: Mar. 1, 2002

(65) Prior Publication Data
US 2002/0163330 A1 Nov. 7, 2002

(30) Foreign Application Priority Data
Apr. 3, 2001 (JP) ......................... 2001-104267

(51) Int. Cl.[7] ..................... G01R 33/00; G01R 33/02; F16D 65/21; G01B 7/14
(52) U.S. Cl. ..................... 324/258; 324/225; 324/239; 324/207.17; 361/143
(58) Field of Search ..................... 324/225, 239–243, 324/253–255, 258, 260, 207.17; 188/161, 163, 164; 192/84.1, 84.31; 361/143, 159, 160; 73/862.69

(56) References Cited
U.S. PATENT DOCUMENTS 3,541,432 A * 11/1970 Scarbrough ............... 324/255
4,305,035 A * 12/1981 Mach et al. ............... 324/255
4,933,637 A * 6/1990 Ueda et al. ............... 324/253
5,278,500 A * 1/1994 Seitz ..................... 324/239 X
6,208,497 B1 * 3/2001 Seale et al. ............... 361/160
6,300,733 B1 * 10/2001 Bergstrom ............. 361/160 X

FOREIGN PATENT DOCUMENTS
JP    4-312217    11/1992

* cited by examiner

Primary Examiner—Gerard R. Strecker
(74) Attorney, Agent, or Firm—Armstrong, Westerman & Hattori, LLP.

(57) ABSTRACT

A magnetic flux detector has a core member and an armature member. The core member generates a magnetic flux by an exciting coil receiving an excitation current controlled by an excitation current controller. The magnetic flux detector also has a search coil provided in a magnetic path for the magnetic flux, and a magnetic flux calculator, which determines the magnitude of the magnetic flux by measuring an electromotive force induced in the search coil by a change in the magnetic flux. The excitation current controller controls the excitation current to increase from zero to a predetermined value during a first predetermined time period and then to decrease to zero during a second predetermined time period. The magnetic flux calculator determines the magnitude of the magnetic flux based on the integrated electromotive forces during the first and second time periods.

6 Claims, 6 Drawing Sheets

DETECTOR AND METHOD THEREOF FOR DETERMINING MAGNETIC FLUX BASED ON ELECTROMOTIVE FORCE INDUCED BY AN EXCITATION CURRENT

FIELD OF THE INVENTION

The present invention relates to a detector which detects a magnetic flux generated by an exciting coil being supplied with an excitation current, and it relates also to a method used for detection of the magnetic flux.

BACKGROUND OF THE INVENTION

Electromagnetic devices whose solenoids are supplied with excitation currents to generate magnetic fluxes are well known, and electromagnetic clutches, which utilize electromagnetic forces generated by such electromagnetic devices for engaging the clutch discs, are also well known. For example, Japanese Laid-Open Patent Publication No. H04 (1992)-312217 discloses an arrangement in which a differential limiter that is activated by the engagement of a main clutch is provided to the rear differential gears of an automobile, the main clutch being operated by a pilot clutch which comprises an electromagnetic clutch. In this arrangement, the duty value for the excitation current supplied to the solenoid of the electromagnetic clutch is controlled in feedback of the engaging force (clutching force) of the electromagnetic clutch, which force is being detected. The detection of the engaging force of the clutch for this feedback control is performed by detecting a leakage flux of the main magnetic flux, which is being generated by the solenoid, with a magnetic flux density sensor comprising a Hall element.

In such an arrangement, as a leakage flux based on the main magnetic flux is determined in magnetic flux density by a hall element, in the assemblage, a little misalignment of the magnetic flux density sensor, which comprises a hall element, affects the accuracy of the detection. This is a problem that affects accuracy in detecting the magnetic flux. In addition, if an attempt to improve the efficiency of the magnetic circuit is attempted, then such an attempt will cause a reduction in the magnitude of the leakage flux and thus will also lead to a reduction in the accuracy of the detection. In other words, although the efficiency of the magnetic circuit is improved when the leakage flux is reduced, the reducing of the leakage flux can reduce the accuracy of the magnetic flux detection.

SUMMARY OF THE INVENTION

It is an object of this invention to provide a magnetic flux detector and a method for magnetic flux detection which is used to detect directly a main magnetic flux itself in a magnetic path.

Another object of this invention is to provide a magnetic flux detector and a method for magnetic flux detection which achieves a highly accurate magnetic flux detection even if a leakage flux is minimized.

To achieve these objectives, a magnetic flux detector according to the present invention comprises a magnetic flux generator (for example, the armature member 11 and the core member 12 described in the following embodiment), an excitation current controller, a search coil and a magnetic flux calculator. The magnetic flux generator includes an exciting coil, to which an excitation current is supplied to generate a magnetic flux, and the excitation current controller controls the excitation current supplied to the exciting coil. The search coil is placed in a magnetic path where the magnetic flux generated by the magnetic flux generator passes, such that an electromotive force is induced in the search coil by a change in the magnetic flux, and the magnetic flux calculator determines the magnitude of the magnetic flux generated by the magnetic flux generator by measuring the electromotive force induced in the search coil. In this arrangement, the excitation current controller controls the excitation current to increase from zero to a predetermined current value during a first predetermined time period and thereafter to decrease from the predetermined current value to zero during a second predetermined time period. The magnetic flux calculator determines the magnitude of the magnetic flux generated by the magnetic flux generator based on the difference between the increasing electromotive force integral value which is the integral of the electromotive force induced in the search coil during the first predetermined time period and the decreasing electromotive force integral value which is the integral of the electromotive force induced in the search coil during the second predetermined time period.

In the magnetic flux detector, the search coil is placed in the magnetic path of the magnetic flux (so-called main magnetic flux) generated by the magnetic flux generator. Because of this arrangement, an electromotive force is induced in the search coil when there is a change in the magnetic flux. When this electromotive force is integrated for a time period, the magnetic flux that is passing through the magnetic path is determinable accurately. This arrangement effectively eliminates a problem or errors which may otherwise occur if the sensor is misaligned as in a case of prior art where the sensor comprises a Hall element to detect a leakage flux for determination of the magnitude of the magnetic flux. Also, this arrangement secures the accuracy of the magnetic flux detector because it is immune to a flux leakage reduction, which can result from an improvement in the efficiency of the magnetic circuit.

Furthermore, because the magnetic flux calculator determines the magnitude of the magnetic flux based on the difference between the increasing electromotive force integral value and the decreasing electromotive force integral value, even if a drift exists in the reading of the electromotive force induced in the search coil while the excitation current is nil or even if the electromotive force is offset, the drift or offset value is canceled out when the difference is obtained from these two integral values. Therefore, the magnetic flux detector can perform accurate magnetic flux detection without any adverse effect from a drift or offset which may exist. As the magnetic flux detector does not require any calculation for the cancellation of the effect of a drift or offset, it can perform magnetic flux detection in a quick and simple manner.

Preferably, the excitation current controller controls the excitation current to make the integral value for the increased part, which corresponds to the increased part of the electromotive force induced in the search coil during the first predetermined time period, equal to the integral value for the decreased part, which corresponds to the decreased part of the electromotive force induced in the search coil during the second predetermined time period.

To achieve this, more specifically, the excitation current controller controls the excitation current to make the first and second predetermined time periods equal to each other, and to make the absolute value of the rate of increase of the excitation current during the first predetermined time period, equal to the absolute value of the rate of decrease of the excitation current during the second predetermined time period.

Theoretically, the determination of the magnitude of the magnetic flux is possible either based on the integral value for the increased part, which corresponds to the increased part of the electromotive force in the increasing electromotive force integral value, or the integral value for the decreased part, which corresponds to the decreased part of the electromotive force in the decreasing electromotive force integral value, because the integral value of either the increased part or the decreased part corresponds to the magnetic flux. However, in reality, the integral value for the increased part and the integral value for the decreased part differ from each other because the real excitation current applied can differ from the target excitation current, and the characteristics of the magnetic flux generated are affected by the excitation current being applied. To avoid such a problem, the integral value for the increased part and the integral value for the decreased part are averaged to determine the magnitude of the magnetic flux by calculating the difference between these two values. In this way, the magnetic flux detector can perform accurate magnetic flux detection.

Furthermore, the magnetic flux detector may comprise an electromotive force offset adjuster, which offsets both the electromotive force induced in the search coil during the first predetermined time period and the electromotive force induced in the search coil during the second predetermined time period either to positive values or to negative values. With this arrangement, the electromotive force is always detected as positive values (or negative values), so the magnetic flux detector can be simplified in construction, and the detection process can be also simplified.

Moreover, the present invention provides a method for determining a magnetic flux which is generated by an exciting coil being supplied with an excitation current. This method determines the magnitude of the magnetic flux by measuring an electromotive force induced in a search coil which is placed in a magnetic path while the electromotive force is being induced by a change in the magnetic flux passing through the magnetic path. According to this method, at first, an increasing electromotive force integral value is calculated by integrating the electromotive force induced in the search coil while the exciting coil is being supplied with the excitation current that increases from zero to a predetermined current value during a first predetermined time period. After the first predetermined time period, a decreasing electromotive force integral value is calculated by integrating the electromotive force induced in the search coil while the exciting coil is being supplied with the excitation current that decreases from the predetermined current value to zero during a second predetermined time period. Then, the magnetic flux generated in the magnetic path is determined based on the difference calculated by subtracting the decreasing electromotive force integral value based on the increasing electromotive force integral value.

According to this magnetic flux detection method, because the search coil is placed in the magnetic path of a magnetic flux (so-called main magnetic flux) generated by the magnetic flux generator to induce an electromotive force directly in the search coil by a change in the magnetic flux, the magnetic flux passing through the magnetic path is determinable accurately by integrating the electromotive force for a time period. This method effectively eliminates a problem or errors which may otherwise occur if the sensor is misaligned as in a case of prior art where the sensor comprises a Hall element to detect a leakage flux for determination of the magnitude of the magnetic flux. Also, this method secures the accuracy of the magnetic flux detection because it is immune to a flux leakage reduction, which can result from an improvement in the efficiency of the magnetic circuit.

In addition, in this method, because the magnetic flux is determined based on the difference between the increasing electromotive force integral value and the decreasing electromotive force integral value, even if a drift exists in the reading of the electromotive force induced in the search coil while the excitation current is nil or even if the electromotive force is offset, the drift or offset value is canceled out when the difference is obtained based on these two integral values. Therefore, this method offers an accurate magnetic flux detection that is not affected by a drift or offset which may exist. Also, as the method does not require any calculation for the cancellation of the effect of a drift or offset, it enables a quick and simple magnetic flux detection.

In the magnetic flux detection method according to the present invention, preferably, the increasing characteristic of the excitation current observed during the first predetermined time period and the decreasing characteristic of the excitation current observed during the second predetermined time period are controlled to make the absolute value of the integral value for the increased part, which is calculated by integrating the increased part of the electromotive force induced in the search coil while the excitation current supplied to the exciting coil is being increased during the first predetermined time period, equal to the absolute value of the integral value for the decreased part, which is calculated by integrating the decreased part of the electromotive force induced in the search coil while the excitation current supplied to the exciting coil is being reduced during the second predetermined time period.

Even though it is possible to determine the magnitude of the magnetic flux either based on the integral value for the increased part, which corresponds to the increased part of the electromotive force in the increasing electromotive force integral value, or based on the integral value for the decreased part, which corresponds to the decreased part of the electromotive force in the decreasing electromotive force integral value, if the increasing and decreasing characteristics of the excitation current are controlled as described above, the difference between the integral value for the increased part and that for the decreased part is calculated to determine the magnitude of the magnetic flux as an average value. In this way, the method can provide a more accurate magnetic flux detection.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings, which are given by way of illustration only and thus are not limitative of the present invention.

DESCRIPTION OF THE PREFERRED EMBODIMENTS

Figure 1:
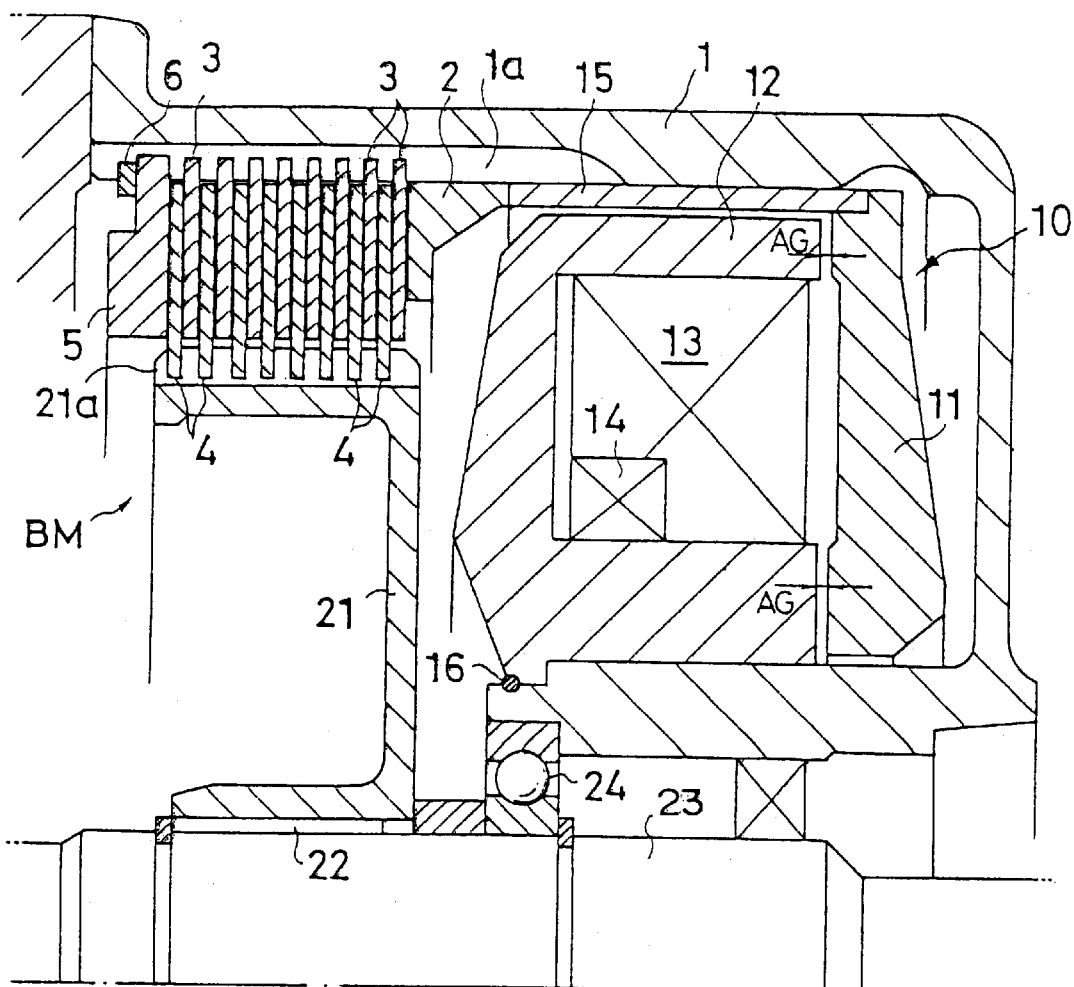
FIG. 1 is a cross-sectional view of an electromagnetic brake which comprises a magnetic flux detector according to the present invention.

Now, preferred embodiments of magnetic flux detector according to the present invention are described in reference to the drawings. FIG. 1 shows an electromagnetic brake which comprises a magnetic flux detector according to the present invention. This electromagnetic brake comprises, in a fixed and stationary cylindrical brake housing 1, a multiple disk brake mechanism BM and an electromagnetic presser mechanism 10, which generates and provides a brake engaging force for the multiple disk brake mechanism BM. The electromagnetic brake slows or stops the rotation of a rotating shaft 23, which is provided centrally through the brake housing 1 and supported on ball bearings 24, rotatably with respect to the brake housing 1. For effective braking operation, the rotating shaft 23 is provided with a brake hub 21, which is mounted thereon through splines.

The multiple disk brake mechanism BM includes a plurality of separator plates 3 and a plurality of friction plates 4 in the brake housing 1. The peripheral portions of the separator plates 3 are engaged to inner splines 1a which are provided in the inner peripheral wall of the brake housing 1. With this arrangement, the separator plates 3 are movable axially, but its rotation is restricted. On the other hand, each of the friction plates 4 is composed of a metallic disk and facings, which are laminated on both the sides of the disk, and each friction plate 4 is positioned between the successive separator plates 3. In other words, the separator plates 3 and the friction plates 4 are alternately placed one after another in the axial direction. The inner portions of the friction plates 4 are engaged to outer splines 21a which are provided on the outer peripheral wall of the brake hub 21, so the friction plates 4 are movable axially and rotates with the rotating shaft 23 in unison.

On the left side of the separator plates 3 and friction plates 4, which are arranged in the brake housing 1 as described above, an end plate 5 is provided with a retaining ring 6, which restricts the leftward movement of the end plate 5 in the axial direction. On the other hand, a pressure plate 2 is provided on the right side of the separator plates 3 and friction plates 4. In this arrangement, when the pressure plate 2 is pushed leftward to press the separator plates 3 and friction plates 4 onto the end plate 5, a friction is generated between the sides of the separator plates 3 and the facings of the friction plates 4 to bring the rotational speed of the friction plates 4 to that of the separator plates 3 as a braking action. In other words, the separator plates 3 are rotationally fixed to the brake housing 1 through splines while the friction plates 4 are rotationally connected to the brake hub 21 also through splines to rotate with the rotating shaft 23 like a one-piece body as described above. When the pressure plate 2 is pushed leftward, the rotation of the friction plates 4, i.e., the rotation of the rotating shaft 23 is damped.

It is the function of the electromagnetic presser mechanism 10 to achieve the leftward movement of the pressure plate 2. The electromagnetic presser mechanism 10, which is placed in the brake housing 1, has a ring figure with a horizontally laid U-shaped cross section and comprises a core or yoke member (hereinafter referred to as "core member") 12, a ring-like exciting coil 13, a ring-like search coil 14, a disk-like armature member 11 and a cylindrical pressing member 15. The core member 12 is fixed by a retaining ring 16 in the brake housing 1, and the exciting coil 13 and the search coil 14 are provided adjacent to each other, and are fixed in the groove of the core member 12, which groove is defined by the horizontally laid U-shaped cross section. The armature member 11 is provided opposite to the opening of the groove of the core member 12, and the pressing member 15 is connected to the outer periphery of the armature member 11. In this construction, the armature member 11 together with the pressing member 15 is movable axially in the brake housing 1 to bring the left end face of the pressing member 15 into contact with the right end face of the pressure plate 2. Alternatively, the pressure plate 2 and the pressing member 15 can be formed in a one-piece body.

Figure 2:
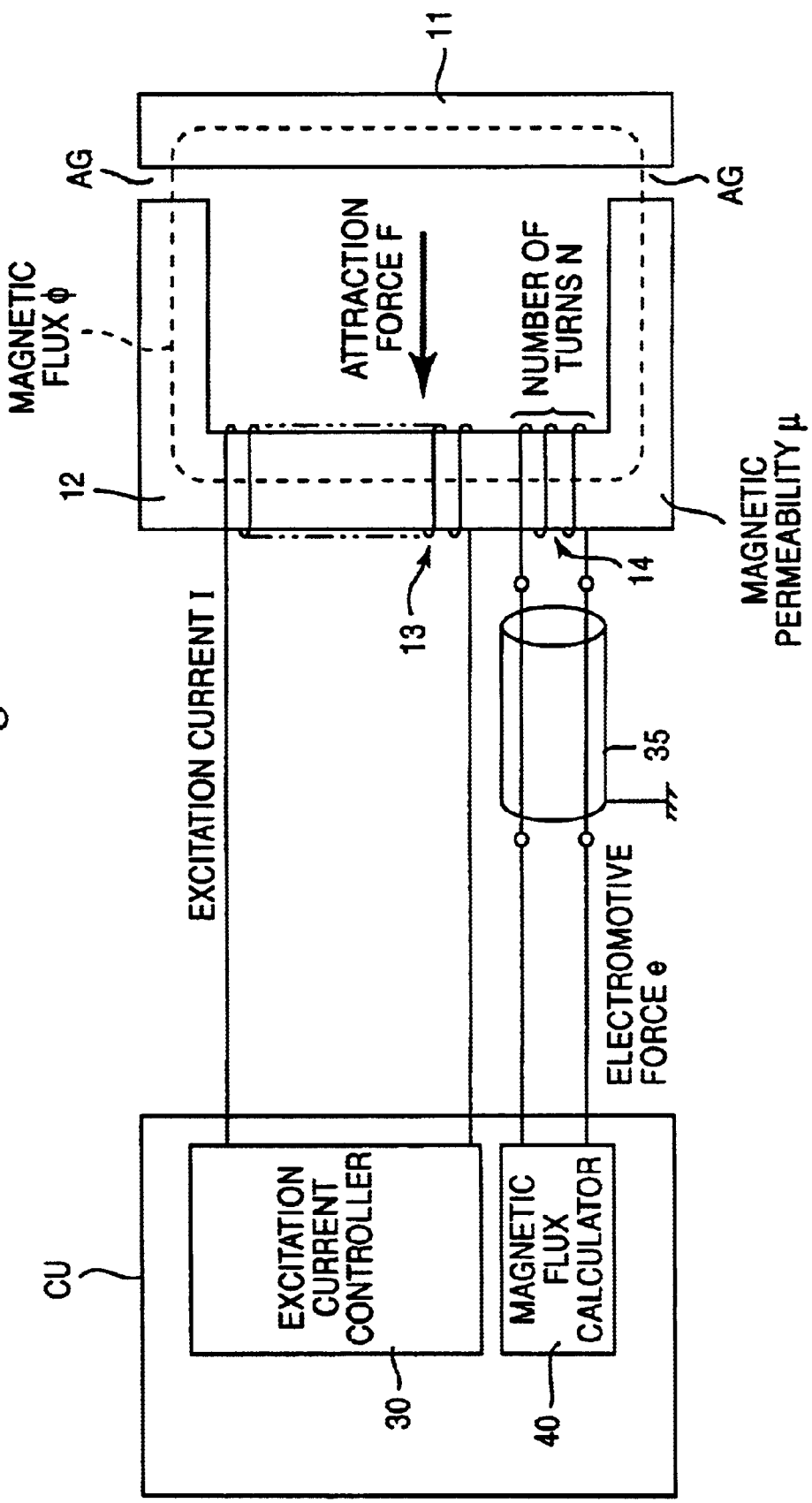
FIG. 2 is a schematic diagram of an electromagnetic presser mechanism that constitutes the electromagnetic brake.

FIG. 2 is a schematic diagram to illustrate the operation of the electromagnetic presser mechanism 10. When an excitation current I is supplied from an excitation current controller 30 provided in a control unit CU to the exciting coil 13, a magnetic flux φ (shown in broken line) is generated through the core member 12 and the armature member 11 with a force F attracting the armature member 11 to the core member 12. When the attraction force F acts on the armature member 11, the armature member 11 together with the pressing member 15 is shifted leftward in the drawing of FIG. 1, with the left end face of the pressing member 15 meeting the right end face of the pressure plate 2. As a result, the pressure plate 2 is pushed leftward, pressing the separator plates 3 and the friction plates 4 onto the end plate 5 and thereby braking the rotation of the rotating shaft 23.

This braking force corresponds to the attraction force F acting on the armature member 11. Therefore, by controlling the excitation current I, which is supplied from the excitation current controller 30 of the control unit CU to the exciting coil 13, the braking operation of the rotating shaft 23 is controllable. To convey the attraction force F acting on the armature member 11 directly to the pressure plate 2, a clearance (hereinafter referred to as "air gap AG") is provided between the right end face of the core member 12 and the left end face of the armature member 11 even while the pressing member 15 is in contact with the pressure plate 2. As the air gap AG becomes smaller as the facings of the friction plates 4 wear away, it is necessary to adjust the supply control of the excitation current I in correspondence to the change of the air gap AG, so that the attraction force F will be always set to a desirable level. For this purpose, the search coil 14 should always detect accurately the magnetic flux φ, which changes correspondingly to the change of the air gap AG. The following is a description of the magnetic flux detection performed by the search coil 14.

When the excitation current I is supplied to the exciting coil 13 to generate a magnetic flux φ, an electromotive force e is induced in the search coil 14 correspondingly to the rate of change of the magnetic flux φ(dφ/dt). To detect the electromotive force e being generated in the search coil 14, the search coil 14 is connected through a shielded cable 35 to a magnetic flux calculator 40 provided in the control unit CPU as shown in FIG. 2. The magnetic flux calculator 40 detects the electromotive force e being induced in the search coil 14 and calculates the magnitude of the magnetic flux φ based on the detected value of the electromotive force e.

Figure 3:
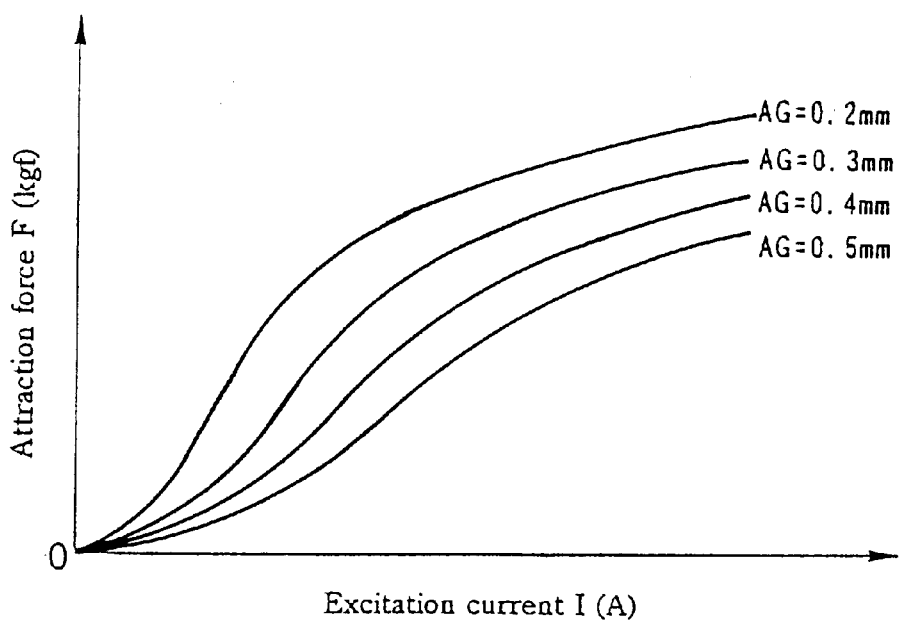
FIG. 3 is a graph showing a relation between excitation current I and the attraction force F of the electromagnetic presser mechanism.

To illustrate this calculation of the magnetic flux φ, at first, relations among the excitation current I, the attraction force F, the magnetic flux (effective magnetic flux) φ and the air gap AG are described. FIG. 3 shows the characteristics of the attraction force F observed for the change of the excitation current I when the air gap AG is set to 0.2 mm, 0.3 mm, 0.4 mm and 0.5 mm, respectively, in the electromagnetic brake shown in FIG. 1. It is clear from the graph that the attraction force F increases as the excitation current I increases as long as the air gap AG is kept constant. On the other hand, if the excitation current I is kept constant, the attraction force F becomes smaller as the air gap AG increases.

Figure 4:
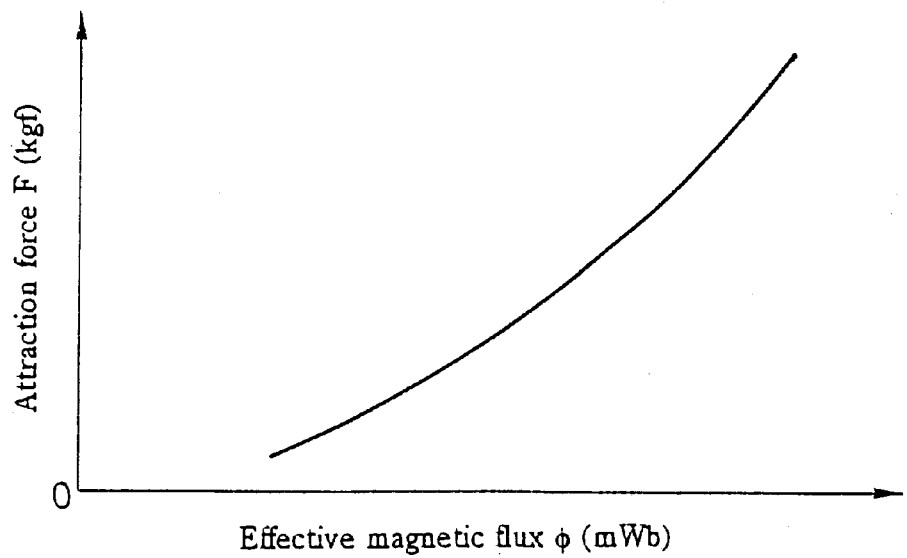
FIG. 4 is a graph showing a relation between the effective magnetic flux φ and the attraction force F of the electromagnetic presser mechanism.

However, the relation between the attraction force F and the effective magnetic flux φ generated by the exciting coil 13 is not affected by the change of the air gap AG, and the attraction force F increases as the effective magnetic flux φ increases as shown in FIG. 4. Therefore, the relations described in FIGS. 3 and 4 must be considered together to determine the size or change of the air gap AG from the excitation current I and the magnetic flux φ being detected. On the basis of the air gap AG thus determined, the excitation current I supplied to the exciting coil 13 can be controlled in a precise manner. Furthermore, by knowing the effective magnetic flux φ in the relation shown in FIG. 4, the attraction force F acting on the armature member 11, i.e., the braking force, can be determined.

For this purpose, the magnetic flux calculator 40 calculates the magnitude of the effective magnetic flux φ based on the electromotive force e induced in the search coil 14. The calculation is possible because there is a relation among the electromotive force e, the number of turns N of the search coil 14 and the rate of chronological change d φ/dt of the magnetic flux φ generated by the exciting coil 13 as described in the following equation (1) (Faraday's law).

$$e = N(d\phi/dt) \quad (1)$$

The magnetic flux φ can be calculated by integrating the rate of chronological change d φ/dt over a time period, so the magnetic flux calculator 40 calculates the magnetic flux φ by using the following equation (2), which is a variation of the above equation (1).

$$\phi = (1/N)\int e\,dt + C \quad (2)$$

Here, C is a constant of integration, and it is reset every time when the excitation current I is supplied to the exciting coil 13.

As described above, the magnetic flux detection performed by the magnetic flux calculator 40 does not use a prior-art magnetic flux density sensor, which includes a Hall element, but utilizes the search coil 14, which is provided in the magnetic flux φ to detect the electromotive force e induced in therein. As a result, the present invention can provide a more accurate magnetic flux detector. After the magnetic flux φ is determined, the attraction force F acting on the armature member 11 (the pressing force acting on the multiple disk brake mechanism BM) can be calculated from the following equation (3), which uses the relations of the magnetic permeability μ and the cross-sectional area S of the air gap between the armature member 11 and the core member 12.

$$F = \phi^2/(2\mu S) \quad (3)$$

Figure 5A:
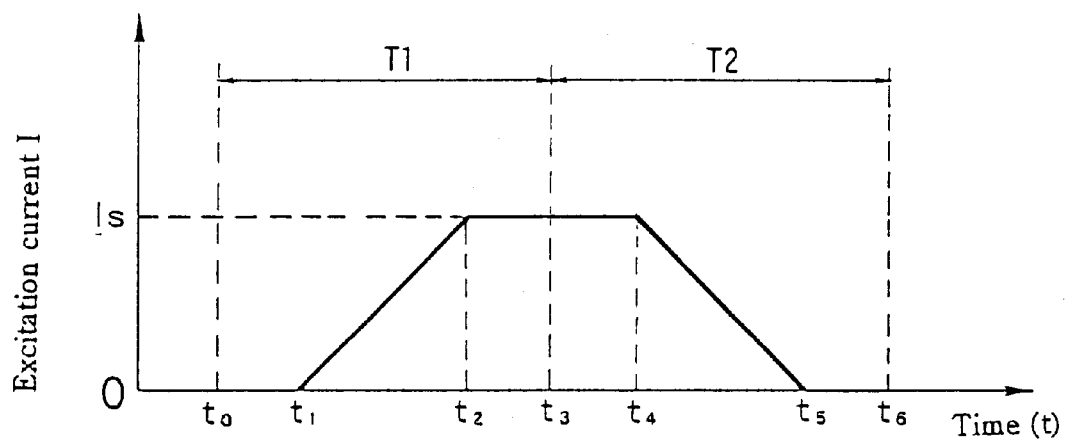
FIGS. 5A, 5B and 5C are graphs showing, respectively, a pattern of chronological change observed in the excitation current I supplied to the electromagnetic presser mechanism, a pattern of chronological change in the electromotive force e induced in the search coil with no drift electromotive force, and a pattern of chronological change in the electromotive force e induced in the search coil with a presence of drift electromotive force.

As described above, the magnetic flux φ is calculated by integrating the electromotive force e being induced in the search coil 14 (refer to the above equation (2)). However, the electromotive force e itself changes in response to the pattern of how the excitation current I is applied. Therefore, the present invention applies the excitation current I in the pattern shown in FIG. 5A for the determination of the magnitude of the magnetic flux φ and the size or change of the air gap AG. As shown in FIG. 5A, the excitation current increases from zero to a predetermined current value Is during a first predetermined time period T1 from time t0 to t3, and then, it decreases from the predetermined current value Is to zero during a second predetermined time period T2 from time t3 to t6.

Figure 5B:
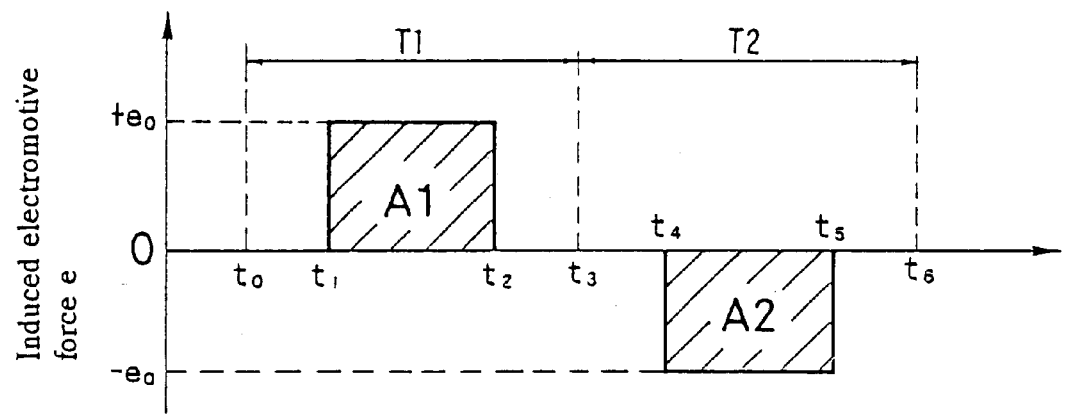

With the excitation current I being applied to the exciting coil 13 in the pattern shown in FIG. 5A, a positive electromotive force +e0 is induced while the excitation current is being increased (period from time t1 to t2) on one hand, and a negative electromotive force −e0 is induced while the excitation current is being reduced (period from time t4 to t5) on the other hand. In this example, the rate of increase and the rate of decrease of the excitation current are set constant and equal to each other in absolute value, so both the electromotive forces +e0 and −e0 have the same constant absolute value as shown in FIG. 5B.

If the excitation current I is applied to the exciting coil 13 in accordance with the above described pattern, then the magnetic flux φ generated while the predetermined current value Is is maintained for the excitation current I (period from time t2 to t4) can be calculated as the integral value of the electromotive force e induced while the excitation current I is increased from zero to the predetermined current value Is (integral value of the electromotive force induced during the first predetermined time period T1) and also as the integral value of the electromotive force e induced while the excitation current I is decreased from the predetermined current value Is to zero (integral value of the electromotive force induced during the second predetermined time period T2) as described in the above equation (2). Therefore, the area A1 defined by the magnitude of the electromotive force e and the time period between time t1 and t2 for the electromotive force e induced for the time period between time t0 and t3 in FIG. 5B corresponds to the magnetic flux φ generated by the excitation current I applied at the predetermined current value Is. Also, the area A2 defined by the magnitude of the electromotive force e and the time period between time t4 and t5 for the electromotive force e induced for the time period between time t3 and t6 in FIG. 5B corresponds to the magnetic flux φ generated by the excitation current I applied at the predetermined current value Is. Theoretically, the calculation of either area A1 or area A2 gives a determination of the magnitude of the magnetic flux φ.

Figure 5C:
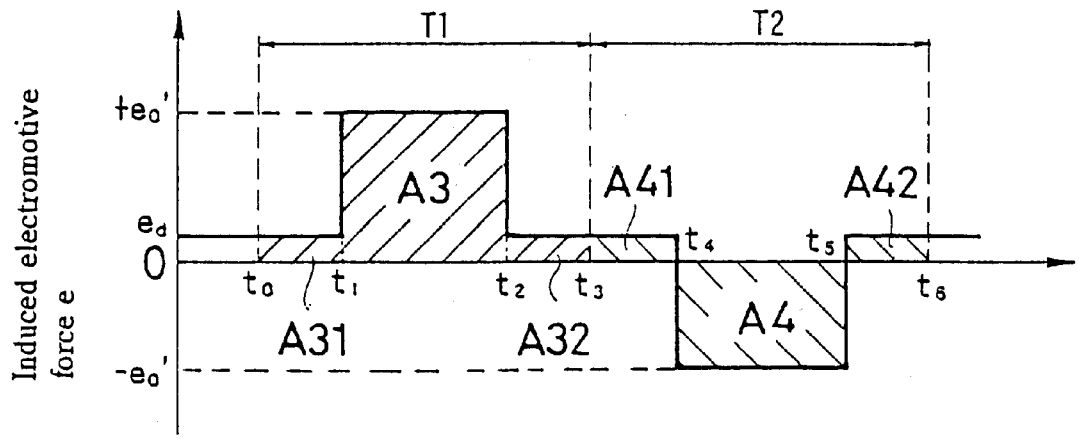

In reality, a so-called drift electromotive force ed, i.e., an error electromotive force, is often observed while the excitation current I is kept at zero as shown in FIG. 5C. If an integration is executed for the electromotive force e induced during the first predetermined time period T1 (or during the second predetermined time period T2) in such a condition, then the calculated value for the magnetic flux φ will include an error which corresponds to the drift electromotive force ed, making the magnetic flux detection inaccurate. To solve this problem, the magnetic flux calculator 40 calculates the magnetic flux φ by subtracting the integral value of the electromotive force for the second predetermined time period T2 (hereinafter referred to as "decreasing electromotive force integral value") from the integral value of the electromotive force for the first predetermined time period T1 (hereinafter referred to as "increasing electromotive force integral value") and by halving the value achieved from the subtraction.

It is clear from FIG. 5C that the drift electromotive force ed is always constant. Therefore, as long as the first predetermined time period T1 and the second predetermined time period T2 have the same value, i.e., T1=T2, the drift electromotive force ed can be canceled out just by subtracting the reducing electromotive force integral value based on the increasing electromotive force integral value to calculate the magnetic flux φ accurately without the effect of the drift electromotive force ed. In other words, the total area of areas A41 and A42 in FIG. 5C is subtracted from the total area of areas A31 and A32, with a resultant difference of zero, so the magnetic flux φ is calculated from the average of areas A3 and A4, which correspond respectively to the electromotive forces actually induced by the change of the excitation current. In this way, the present invention enables accurate detection of the magnetic flux φ without any effect of drift electromotive force ed. In a case where there is no drift electromotive force as shown in FIG. 5B, the total area of area A1 and A2 is calculated by subtracting area A2 (negative value) from area A1 (positive value), and then the total area is divided by 2 to achieve an average area. In this case, the present invention also enables accurate detection of the magnetic flux φ.

In the case shown in FIG. 5A, the rate of increase and the rate of decrease of the excitation current have the same absolute value, so also the positive electromotive force +e0 induced while the excitation current is being increased and the negative electromotive force −e0 induced while the excitation current is being reduced have the same absolute value. Although the rate of increase and the rate of decrease of the excitation current can be set different, it is preferable that both the rates be set to the same absolute value to minimize the error in the magnetic flux detection.

In the above described determination of the magnitude of the magnetic flux φ, the electromotive force e is a positive value for the increasing excitation current while it is a negative value for the decreasing excitation current. Therefore, the magnetic flux calculator 40 needs a circuit to detect both positive and negative electromotive forces. This requirement can complicate the construction of the magnetic flux calculator 40. However, the magnetic flux calculator 40 can be designed as shown in FIG. 6, so that the electromotive force e can be induced always in positive values.

Figure 6:
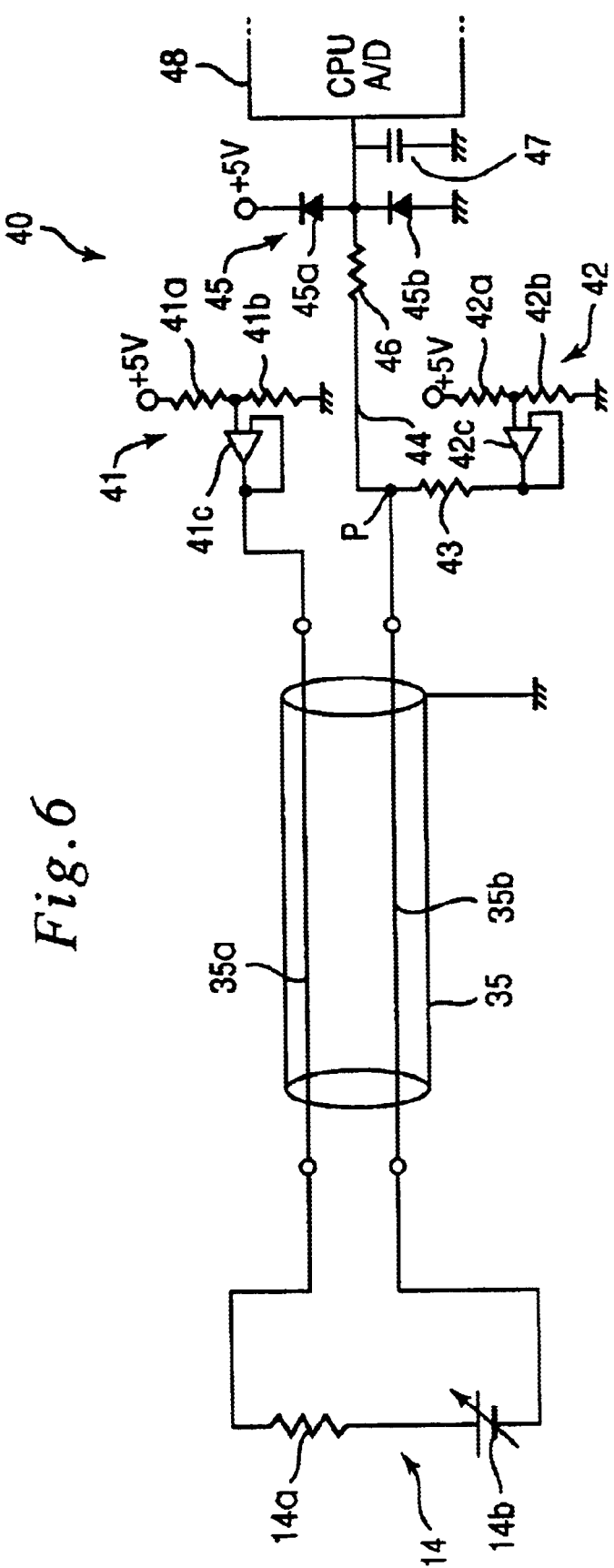
FIG. 6 is an electrical circuit diagram describing a magnetic flux calculator, which generates an offset electromotive force.

The magnetic flux calculator 40 shown in FIG. 6 comprises a high potential setup circuit 41, a low potential setup circuit 42, a potential setup resistor 43, an electromotive force measurement line 44, a protection circuit 45 and a CPU 48. In the high potential setup circuit 41, a power supply of +5 V is connected to two resistors 41a and 41b in series having the same resistance. A high electrical potential VH of +2.5 V drawn through an operational amplifier 41c from a point between the two resistors is led through line 35a of the shielded cable 35 and applied to the search coil 14. In FIG. 6, the resistance of the search coil 14 is indicated by number "14a" while the electromotive force inducing function thereof is indicated by number "14b". On the other hand, in the low potential setup circuit 42, a power supply of +5 V is connected to two resistors 42a and 42b in series having different resistances (the resistance of resistor 42a is larger), and a low electrical potential VL of +0.5 V is drawn through an operational amplifier 42c from a point between these two resistors.

The output of the operational amplifier 42c is led through the potential setup resistor 43 and then through line 35b of the shielded cable 35 and applied to the search coil 14. In addition, to a point between the potential setup resistor 43 and line 35b, the electromotive force measurement line 44 is connected to measure the electrical potential at the point P. The electromotive force measurement line 44 is connected through the protection circuit 45 to the CPU 48. The voltage measured at that point P is passed through analog-digital conversion and taken into the CPU 48, and the measurement data are processed in the CPU to calculate the magnitude of the magnetic flux φ by integration over a time period.

The protection circuit 45 protects the CPU 48 by preventing the voltage of the measurement line 44 from increasing abnormally above a permissible range (for example, 0.3 V ~5.3 V). In the example shown in FIG. 6, the protection circuit 45 includes a diode 45a connected between the 5V power supply and measurement line 44, through a resistor 46. The protection circuit 45 also includes a diode 45b connected in parallel with a capacitor 47 between measurement line 44 (through resistor 46) and ground.

In this example, the potential setup resistor 43 has a resistance B (for example, B=1 kΩ) which is sufficiently larger than the resistance A (A=100Ω) of the search coil 14. Therefore, when the electromotive force e induced in the search coil 14 is nil, the voltage VP at that point P is the voltage (VH=2.5 V) which is set by the high potential setup circuit 41. More precisely, this predetermined voltage VP can be defined by the following equation (4). This voltage is applied to the point P as an offset electromotive force. This means that the electromotive force detected by the CPU 48 always includes this offset value. In other words, the CPU 48 detects the voltage which is the sum of the offset electromotive force and the electromotive force e actually induced in the search coil 14.

$$VP = (VH - VL) \times \{B/(A+B)\} + VL \qquad (4)$$
$$= (2.5 - 0.5) \times (1000/1100) + 0.5$$
$$= 2.31$$

Figure 7A:
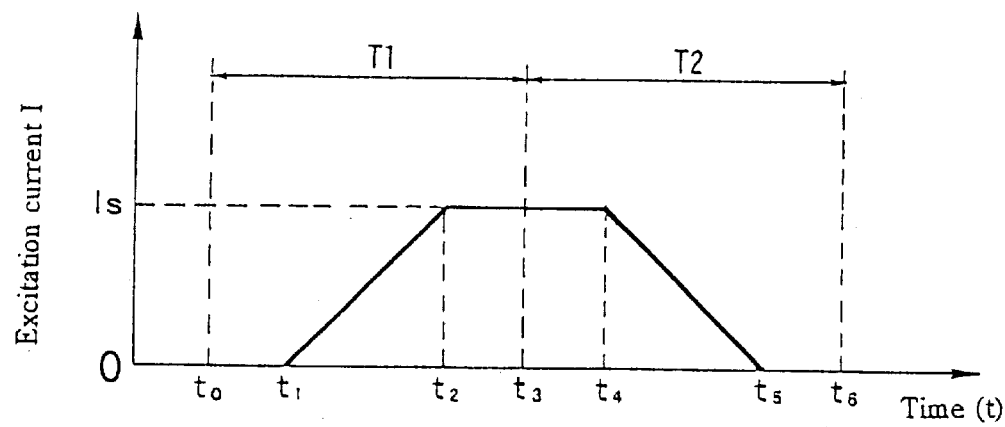
FIGS. 7A and 7B are graphs showing, respectively, a pattern of chronological change observed in the excitation current I supplied to the electromagnetic presser mechanism and a pattern of chronological change in the electromotive force e detected by the magnetic flux calculator shown in FIG. 6.
Figure 7B:
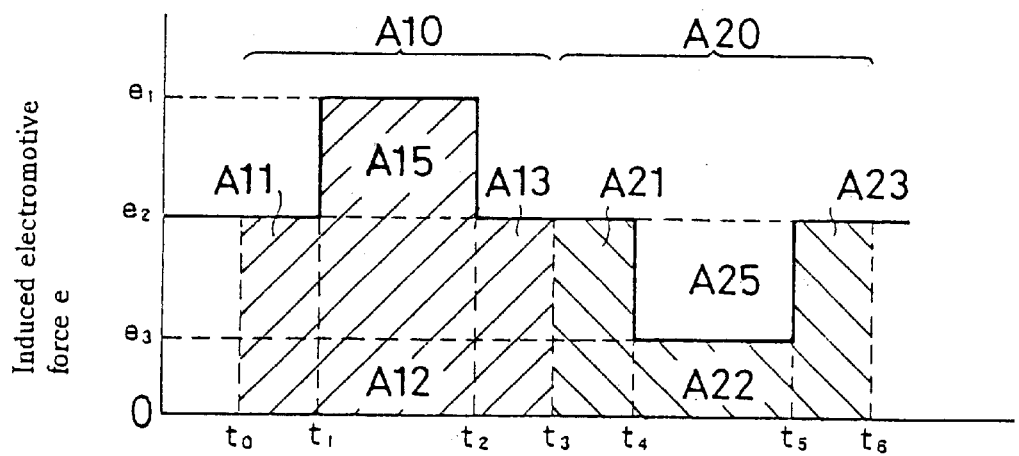

In this magnetic flux calculator 40, when the excitation current is applied to the exciting coil 13 in the pattern shown in FIG. 7A (this pattern is identical with that shown in FIG. 5A), the electromotive force e detected by the CPU 48 appears as shown in FIG. 7B because it includes the offset electromotive force e2 (=VP). In the time period from time t1 to t2, an electromotive force e1 is detected, and the detected value includes a positive electromotive force induced in the search coil 14 (i.e., from the electromotive force inducing function 14b). In the time period from time t4 to t5, an electromotive force e3 is detected, and the detected value includes a negative electromotive force induced in the search coil 14 (i.e., from the electromotive force inducing function 14b). In this case, also, the magnetic flux φ is determined by subtracting the decreasing electromotive force integral value, i.e., the integral value of the electromotive force e for the second predetermined time period T2, from the increasing electromotive force integral value, i.e., the integral value of the electromotive force e for the first predetermined time period T1, and by halving the value achieved from this subtraction.

By subtracting the reducing electromotive force integral value based on the increasing electromotive force integral value, the effect of the offset electromotive force e2 is canceled out in the determination of the magnitude of the magnetic flux φ, making the determination accurate. More specifically, in FIG. 7B, the total area of areas A21 and A23 hatched in the drawing is subtracted from the total area of areas A11 and A13 also hatched, with a resultant difference of zero. Then, the area A22 for the time period between time t4 and t5 is subtracted from the area A12 for the time period between time t1 and t2 to calculate, as an integral value, the sum of the area A15 which corresponds to the integral value of the positive electromotive force actually induced in the search coil 14 and the area A25 which corresponds to the integral value of the negative electromotive force actually induced in the search coil 14. Then, this integral value is halved (for an average) to determine the magnitude of the magnetic flux φ accurately.

Although the magnetic flux detector according to the present invention is applied to an electromagnetic brake as described in the above embodiment, its application is not limited to this example. The magnetic flux detector according to the present invention can be also applied to an electromagnetic clutch and to any type of device which uses an exciting coil to generate an electromagnetic force. Furthermore, in the magnetic flux calculator shown in FIG. 6, the electromotive force induced is offset to appear always as positive values in voltage. However, it may be offset to give always negative values.

As explained above, in a magnetic flux detector according to the present invention, the search coil is positioned in a magnetic path where a magnetic flux (so-called main magnetic flux) generated by a magnetic flux generator passes. As the electromotive force induced in the search coil corresponds directly to the change of the magnetic flux, the determination of the magnitude of the magnetic flux passing through the magnetic path is performed accurately by integrating the electromotive force for a time period. This arrangement effectively eliminates errors which may otherwise occur if the sensor is misaligned, for example, in a case of prior art where the sensor comprises a hall element to detect a leakage flux for determination of the magnitude of the magnetic flux. Also, the accuracy of the magnetic flux detector according to the present invention is immune to any flux leakage reduction, which can result from an improvement made in the efficiency of the magnetic circuit.

Furthermore, because the magnetic flux calculator determines the magnitude of the magnetic flux based on the difference between the increasing electromotive force integral value and the decreasing electromotive force integral value, even if a drift exists in the reading of the electromotive force induced in the search coil while the excitation current is nil or even if the electromotive force is offset, the drift or offset value is canceled out when the difference is obtained from these two integral values. Therefore, the magnetic flux detector can perform accurate magnetic flux detection without any adverse effect from a drift or offset which may exist. As the magnetic flux detector does not require any calculation for the cancellation of the effect of a drift or offset, it can perform magnetic flux detection in a quick and simple manner.

It is preferable that the excitation current controller control the excitation current such that the integral value for the increased part, which corresponds to the increased part of the electromotive force induced in the search coil during the first predetermined time period, equals the integral value for the decreased part, which corresponds to the decreased part of the electromotive force induced in the search coil during the second predetermined time period. To achieve this, the excitation current controller controls the excitation current to make the first and second predetermined time periods equal to each other, and to make the absolute value of the rate of increase of the excitation current during the first predetermined time period, equal to the absolute value of the rate of decrease of the excitation current during the second predetermined time period.

Theoretically, the determination of the magnitude of the magnetic flux is possible either based on the integral value for the increased part, which corresponds to the increased part of the electromotive force in the increasing electromotive force integral value, or the integral value for the decreased part, which corresponds to the decreased part of the electromotive force in the decreasing electromotive force integral value. However, in reality, the integral value for the increased part and the integral value for the decreased part differ from each other because the real excitation current can differ from the target excitation current, and the characteristics of the magnetic flux generated are affected by the excitation current being applied. To avoid such a problem, the integral value for the increased part and the integral value for the decreased part are averaged to determine the magnitude of the magnetic flux by calculating the difference between these two values as described above. In this way, the magnetic flux detector can perform accurate magnetic flux detection.

Furthermore, the magnetic flux detector may comprise an electromotive force offset adjuster, which offsets both the electromotive force induced in the search coil during the first predetermined time period and the electromotive force induced during the second predetermined time period either to positive values or to negative values. With this arrangement, the electromotive force is always detected as positive values (or negative values), so the magnetic flux detector can be simplified in construction, and the detection process can be also simplified.

According to the magnetic flux detection method of the present invention, the search coil is placed in the magnetic path of a magnetic flux (so-called main magnetic flux) generated by the magnetic flux generator, and an electromotive force is induced in the search coil directly by a change in the magnetic flux. When this electromotive force is integrated for a time period, the magnetic flux passing through the magnetic path is determinable accurately. This method effectively eliminates a problem or errors which may otherwise occur if the sensor is misaligned as in a case of prior art where the sensor comprises a hall element to detect a leakage flux for determination of the magnitude of the magnetic flux. Also, this method secures the accuracy of the magnetic flux detection because it is immune to a flux leakage reduction, which can result from an improvement made in the efficiency of the magnetic circuit.

In addition, in this method, the magnetic flux is determined based on the difference between the increasing electromotive force integral value and the decreasing electromotive force integral value. Because of this feature, even if a drift exists in the reading of the electromotive force induced in the search coil while the excitation current is nil or even if the electromotive force is offset, the drift or offset value is canceled out when the difference is obtained from these two integral values. Therefore, the magnetic flux detection method according to the present invention can perform accurate magnetic flux detection without any adverse effect from a drift or offset which may exist. As the method does not require any calculation for the cancellation of the effect of a drift or offset, it enables a quick and simple magnetic flux detection.

In the magnetic flux detection method according to the present invention, preferably, the increasing characteristic of the excitation current observed during the first predetermined time period and the decreasing characteristic of the excitation current observed during the second predetermined time period are controlled to make the absolute value of the integral value for the increased part, which is calculated by integrating the increased part of the electromotive force induced in the search coil while the excitation current supplied to the exciting coil is being increased during the first predetermined time period, equal to the absolute value of the integral value for the decreased part, which is calculated by integrating the decreased part of the electromotive force induced in the search coil while the excitation current supplied to the exciting coil is being reduced during the second predetermined time period. Then, the difference between the integral value for the increased part and the integral value for the decreased part is calculated to determine the magnitude of the magnetic flux as an average value. In this way, the method can provide a more accurate magnetic flux detection.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

Related Applications

This application claims the priority of Japanese Patent Application No. 2001-104267 filed on Apr. 3, 2001, which is incorporated herein by reference.

What is claimed is:

1. A magnetic flux detector comprising:

a magnetic flux generator, which includes an exciting coil and generates a magnetic flux when an excitation current is supplied to said excitation coil;

an excitation current controller, which controls said excitation current being supplied to said exciting coil;

a search coil, which is placed in a magnetic path where the magnetic flux generated by said magnetic flux generator passes, such that an electromotive force is induced in said search coil in response to a change in the magnetic flux; and a magnetic flux calculator, which determines the magnitude of the magnetic flux generated by said magnetic flux generator by measuring the electromotive force induced in said search coil;

wherein:

said excitation current controller controls said excitation current to increase from zero to a predetermined current value during a first predetermined time period and then to decrease from the predetermined current value to zero during a second predetermined time period; and said magnetic flux calculator determines the magnitude of the magnetic flux generated by said magnetic flux generator based on a difference between an increasing electromotive force integral value which is calculated by integrating the electromotive force induced in said search coil during said first predetermined time period and a decreasing electromotive force integral value which is calculated by integrating the electromotive force induced in said search coil during said second predetermined time period.

2. The magnetic flux detector as set forth in claim 1, wherein said excitation current controller controls said excitation current to make an integral value for an increased part, which value corresponds to an increased part of the electromotive force induced in said search coil during said first predetermined time period, equal to an integral value for a decreased part, which value corresponds to a decreased part of the electromotive force induced in said search coil during said second predetermined time period.

3. The magnetic flux detector as set forth in claim 1 or 2, wherein said excitation current controller controls said excitation current to make said first and second predetermined time periods equal to each other, and to make an absolute value of a rate of increase of said excitation current being increased gradually during said first predetermined time period, equal to an absolute value of a rate of decrease of said excitation current being decreased gradually during said second predetermined time period.

4. The magnetic flux detector as set forth in claim 1 or 2, further comprising an electromotive force offset adjuster, which offsets both the electromotive force induced in said search coil during said first predetermined time period and the electromotive force induced in said search coil during said second predetermined time period either to positive values or to negative values.

5. A magnetic flux detection method for determining a magnetic flux that is generated in a magnetic path by an exciting coil being supplied with an excitation current, by measuring an electromotive force induced in a search coil which is placed in said magnetic path;

wherein:

an increasing electromotive force integral value is calculated by integrating the electromotive force induced in said search coil while said exciting coil is being supplied with said excitation current which increases from zero to a predetermined current value during a first predetermined time period;

after said first predetermined time period, a decreasing electromotive force integral value is calculated by integrating the electromotive force induced in said search coil while said exciting coil is being supplied with said excitation current which decreases from said predetermined current value to zero during a second predetermined time period; and the magnitude of the magnetic flux generated in said magnetic path is determined based on a difference calculated by subtracting said decreasing electromotive force integral value from said increasing electromotive force integral value.

6. The magnetic flux detection method as set forth in claim 5, wherein an increasing characteristic of said excitation current observed during said first predetermined time period and a decreasing characteristic of said excitation current observed during said second predetermined time period are controlled to make an absolute value of an integral value for an increased part, which is calculated by integrating the increased part of the electromotive force induced in said search coil while said excitation current supplied to said exciting coil is being increased during said first predetermined time period, equal to an absolute value of an integral value for a decreased part, which is calculated by integrating the decreased part of the electromotive force induced in said search coil while said excitation current supplied to said exciting coil is being reduced during said second predetermined time period.

* * * * *